United States Patent [19]

Ting et al.

[11] Patent Number: 5,708,688

[45] Date of Patent: Jan. 13, 1998

[54] HIGH SPEED PROGRAMMABLE BURST ADDRESS GENERATION CIRCUIT

[75] Inventors: Tah-Kang Joseph Ting, Hsinchu; Ghy-Bin Wang, Chung-Li; Jeng-Tzong Shih, Hsin-Chu, all of Taiwan

[73] Assignee: Etron Technology, Inc., Hsin-Chu, Taiwan

[21] Appl. No.: 652,213

[22] Filed: May 23, 1996

[51] Int. Cl.⁶ .................................................. H03K 21/40
[52] U.S. Cl. ........................... 377/33; 377/44; 377/55; 365/230.08
[58] Field of Search ................................. 377/44, 33, 55; 365/189.01, 230.08, 189.05

[56] References Cited

U.S. PATENT DOCUMENTS

| | | | |
|---|---|---|---|
| 4,360,742 | 11/1982 | Freyman | 307/224 |
| 4,891,827 | 1/1990 | Slater | 377/111 |
| 5,481,581 | 1/1996 | Jonas, Jr. | 377/33 |
| 5,526,320 | 6/1996 | Zagar et al. | 365/230.08 |
| 5,594,765 | 1/1997 | Oh | 377/55 |

*Primary Examiner*—Margaret Rose Wambach
*Attorney, Agent, or Firm*—George O. Saile; Stephen B. Ackerman

[57] ABSTRACT

A programmable burst sequence counter is described. The counter is capable of counting sequences of binary numbers in a linear burst sequence or interleaved burst sequence starting from a initial binary number that is presented to the inputs of the counter. The programmable burst sequence counter is applicable to the generation of addresses for the storage and retrieval of digital data from memory arrays.

9 Claims, 5 Drawing Sheets

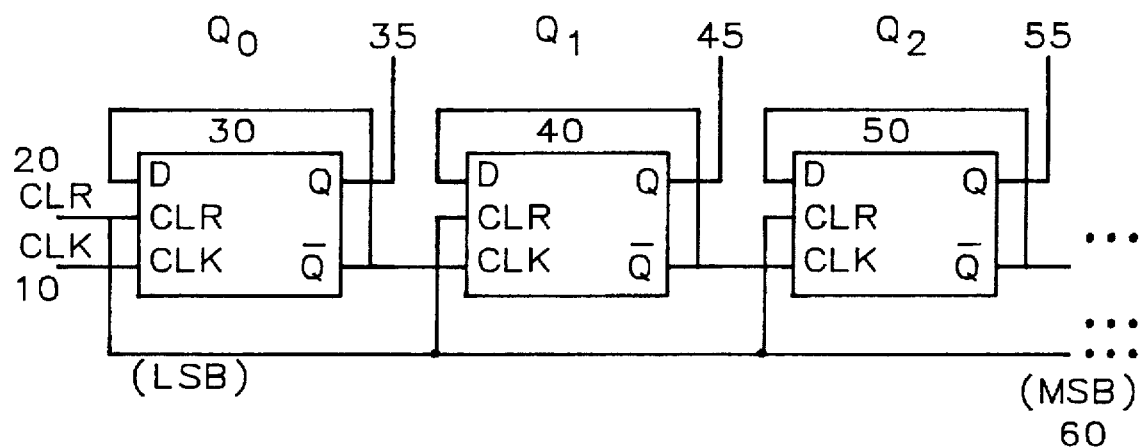
FIG. 1A - Prior Art
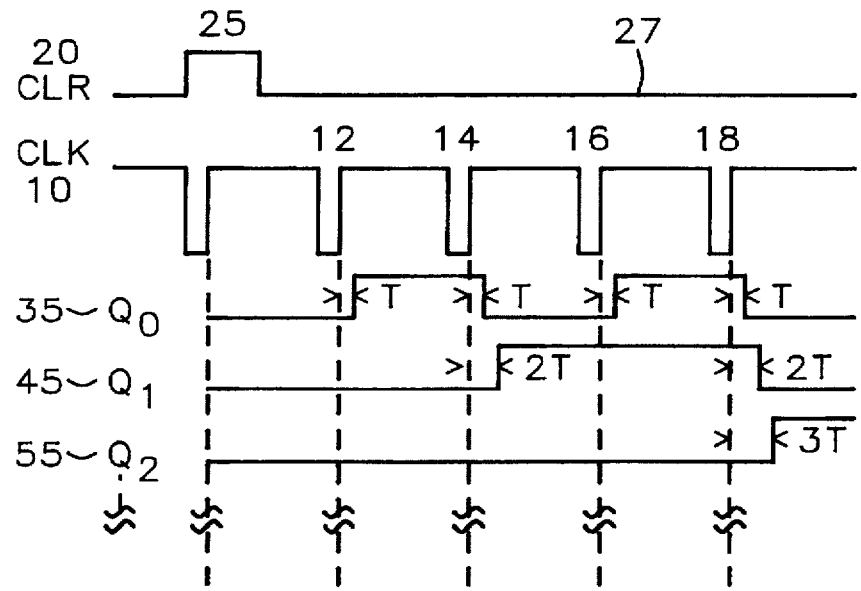
FIG. 1B - Prior Art

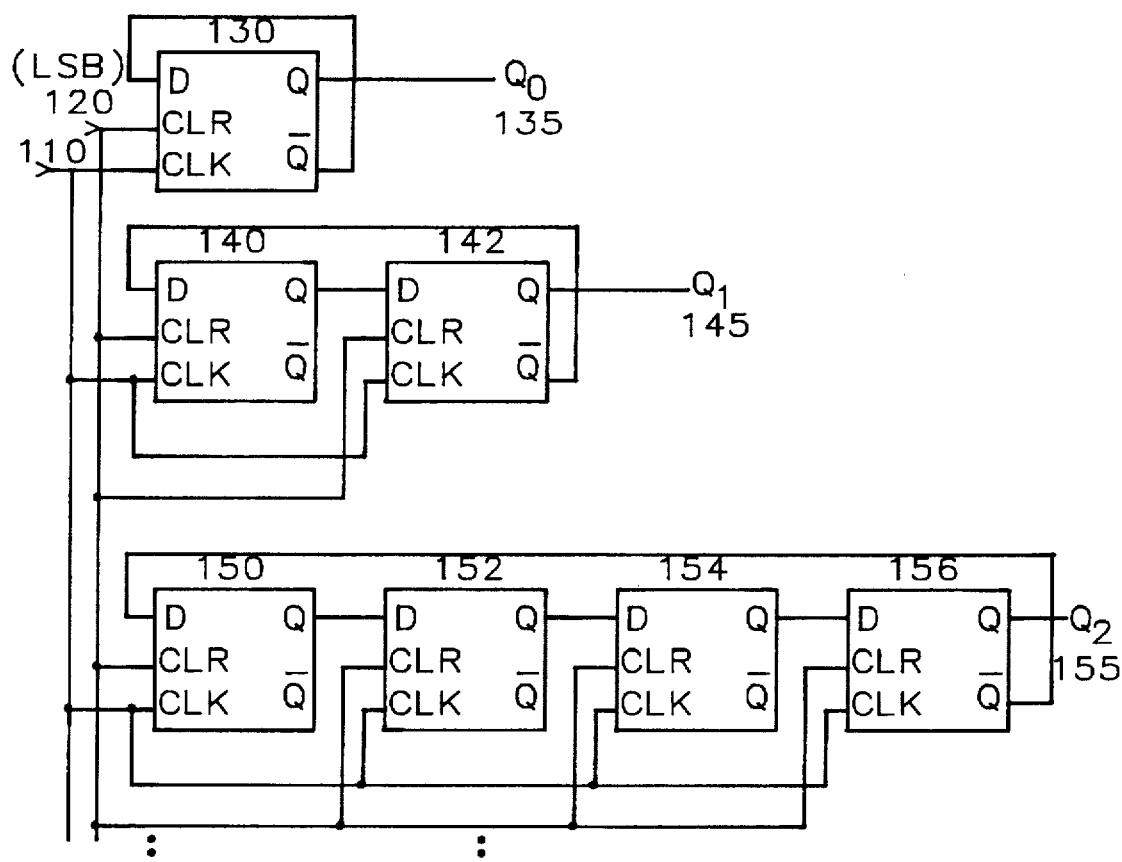
FIG. 2A – Prior Art
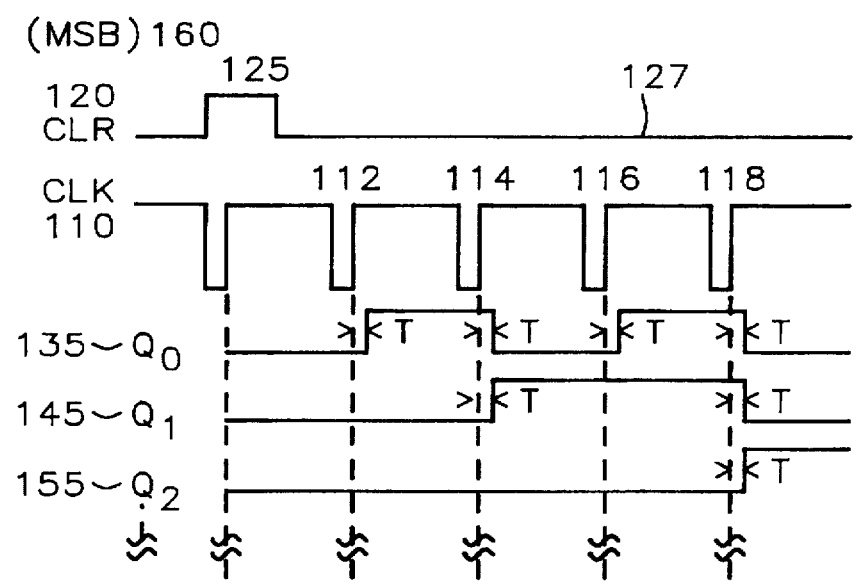
FIG. 2B – Prior Art

HIGH SPEED PROGRAMMABLE BURST ADDRESS GENERATION CIRCUIT

BACKGROUND OF THE INVENTION

1. Field of the Invention

This invention relates to electronic digital counter circuits and more particularly to programmable parallel counters that will provide a sequence of binary numbers as is necessary for address generation for digital memory applications.

2. Description of Related Art

Parallel counters are well known in the art and have applications in such areas as the generation of sequential addresses for the accessing and retrieval of digital data from memory arrays.

FIG. 1a shows a ripple burst counter. The inverted output $\overline{Q}$ of a D-type Flip-Flop 30 is connected to the data input of the D-type Flip-Flop 30 configuring the Flip-Flop as a toggling Flip-Flop. The Flip-Flop will change to the opposite state, that is output $Q_0$ will change from a logic 0 to logic 1 or from a logic 1 to a logic 0, at each rising edge of the clock signal clk 10.

The D-type Flip-Flops 40 and 50 are configured with their inverted output $\overline{Q}$ connected to each of the data inputs D to also form toggling Flip-Flops. The clock clk terminal of D-type Flip-Flop 40 is the inverted output $\overline{Q}$ of D-type Flip-Flop 30 and the clock input clk of D-type Flip-Flop 50 is the inverted output D-type Flip-Flop 40.

The clear signal clr 20 is connected to the clear terminals clr of the D-type Flip-Flops 30, 40, and 50. FIG. 1b shows that when the clear signal clr is brought active 25, the noninverted outputs $Q_0$, $Q_1$, and $Q_2$, are brought to a logic 0 and the inverted outputs $\overline{Q}_0$, $\overline{Q}_1$, and $\overline{Q}_2$ are brought to a logic 1.

After the clear signal clr 20 becomes inactive 27, the next rising edge 12 of the clock clk 10 cause the output $Q_0$ 35 to change to a logic 1 after a logic delay T. At the rising edge 14 of the clock clk 10 the noninverting output $Q_0$ 35 will now change to a logic 0 and the inverting output $\overline{Q}_0$ will change to a logic 1 causing the noninverting output $Q_1$ 45 to change to a logic 1 at a delay time 2T after the rising edge 14 of the clock clk 10. This delay 2T is a result of the delays inherent in the circuitry of the D-type Flip-Flops 30 and 40. At the rising edge 16 of clock clk 10, the noninverting output $Q_0$ 35 again toggles to a logic 1, with the inverted output $\overline{Q}_0$ changing to a logic 0. Finally, at the rising edge 18 of clock clk 10. the noninverting outputs $Q_0$ 35, $Q_1$ 45, and $Q_2$ 55 to change to a logic 0. The change in the noninverting output $Q_2$ 55 to a logic 0 happens at the rising edge of the inverting output $\overline{Q}_1$ and this change will happen at the delay time 3T, which is, again, the circuit delay of each of the D-type Flip-Flops 30, 40, and 50.

FIG. 2a illustrates a technique to prevent the delay of each D-type Flip-Flop from being accumulated with each additional stage as in the ripple burst counter of FIG. 1a. The parallel burst counter of FIG. 2a has a first stage that is a D-type Flip-Flop 130 that is configured as toggling Flip-Flop similar to the first stage 30 of FIG. 1a. The second stage is two D-type Flip-Flops 140 and 142 configured as a toggling Flip-Flop, except that instead of toggling on every clock clk 110 cycle it will toggle on alternate clock clk 110 cycles. The third stage will be formed by D-type Flip-Flops 150, 152, 154, and 156. The D-type Flip-Flops 150, 152, 154, and 156 are configured again as a toggling Flip-Flop that will toggle at every fourth cycle of the clock clk 110. Any number of stages can be added to form a binary number from the outputs $Q_0$ 135, $Q_1$ 145, $Q_2$ 155, . . . . The number of D-type Flip-Flops in each stage will be $2^n$ where n is the stage number of the digit of the binary number.

As is shown in FIG. 2b, each output $Q_0$ 135, $Q_1$ 145, and $Q_2$ 155 is now delayed from the clock by the uniform amount T. This is a result of each D-type Flip-Flop being timed by the same clock clk 110. Thus when the clear signal clr 120 is active 125 all of the noninverting output $Q_0$ 135, $Q_1$ 145, $Q_2$ 155, . . . are brought to a logic 0. The clear signal clr 120 becomes inactive 127 and at each rising edge 112, 114, 116, and 118 of the clock, the noninverting outputs $Q_0$ 135, $Q_1$ 145, and $Q_2$ 155 of the counter assume the next binary number of the sequence.

The only sequence of binary numbers that can be generated from the counters of FIG. 1 and FIG. 2 are as shown in Table 1

TABLE 1

|  | Clock | $Q_2$ | $Q_1$ | $Q_0$ |
|---|---|---|---|---|
| Clear | 0 | 0 | 0 | 0 |
|  | 1 | 0 | 0 | 1 |
|  | 2 | 0 | 1 | 0 |
|  | 3 | 0 | 1 | 1 |
|  | 4 | 1 | 0 | 0 |
|  | 5 | 1 | 0 | 1 |
|  | 6 | 1 | 1 | 0 |
|  | 7 | 1 | 1 | 1 |

This pattern will be repeated for subsequent clock cycles clk 10 of FIG. 1a or 110 of FIG. 2a.

U.S. Pat. No. 4,360,742 (Freyman) teaches a technique for a parallel binary counter and rate divider where a series of toggle Flip-Flops are configured such that the frequency output can be a sub-multiple of the input clocking frequency.

U.S. Pat. No. 4,891,827 (Slater) shows a loadable ripple counter wherein an initial binary number can be loaded to the counter and the subsequent binary counts will placed at the outputs at each timing signal.

In memory address generation, a series of sequential addresses are often needed to rapidly retrieve or store data to a memory array. There are two types of sequential address formats that are commonly used, the interleaved burst address and the linear burst address.

Table 2 is the sequence of binary numbers for the interleaved burst address format.

TABLE 2

|  | A[1:0] | A[1:0] | A[1:0] | A[1:0] |
|---|---|---|---|---|
| Start Address | 00 | 01 | 10 | 11 |
| 2nd Address | 01 | 00 | 11 | 10 |
| 3d Address | 10 | 11 | 00 | 01 |
| 4th Address | 11 | 10 | 01 | 00 |

Table 3 is the sequence of binary numbers for the linear burst address format.

TABLE 3

|  | A[1:0] | A[1:0] | A[1:0] | A[1:0] |
|---|---|---|---|---|
| Start Address | 00 | 01 | 10 | 11 |
| 2nd Address | 01 | 10 | 11 | 00 |
| 3d Address | 10 | 11 | 00 | 01 |
| 4th Address | 11 | 00 | 01 | 10 |

The Tables 2 and 3 show only a two digit binary address sequence for reference. Any number of digits may used with these formats.

The counters as shown in the prior art are capable of generation of sequences of the linear burst address only and can not be easily programmed to any other sequence of binary numbers.

SUMMARY OF THE INVENTION

An object of this invention is the creation of a programmable digital sequence counter for the generation of a series of memory addresses. Another object of this invention is providing both an interleaved burst sequence and a linear burst sequence of binary numbers dependent on the programming of the programmable digital sequence counter. Furthermore, still another object of this invention is the counting of the sequence starting from an initial input binary number.

To accomplish these and other objects a programmable digital sequence counter has a counting means that will provide a sequence of linear burst or interleaved burst binary numbers to a plurality of outputs. An external address means provides the initial input binary from which the counting means will begin. A burst sequence means determines which type of binary number sequence the counting means will provide. A clocking signal will synchronize the timing of the counting means while an advancing means will instruct the counting means to determine each subsequent binary number. The clearing means will bring all the output to an initial binary number that is dependent on the external address means.

BRIEF DESCRIPTION OF THE DRAWINGS

FIG. 1a is a schematic diagram of a ripple burst counter of prior art.

FIG. 1b is a timing diagram of the ripple burst counter of prior art.

FIG. 2a is a schematic diagram of a parallel burst counter of prior art.

FIG. 2b is a timing diagram of the parallel burst counter of prior art.

DETAILED DESCRIPTION OF THE INVENTION

Figure 3:
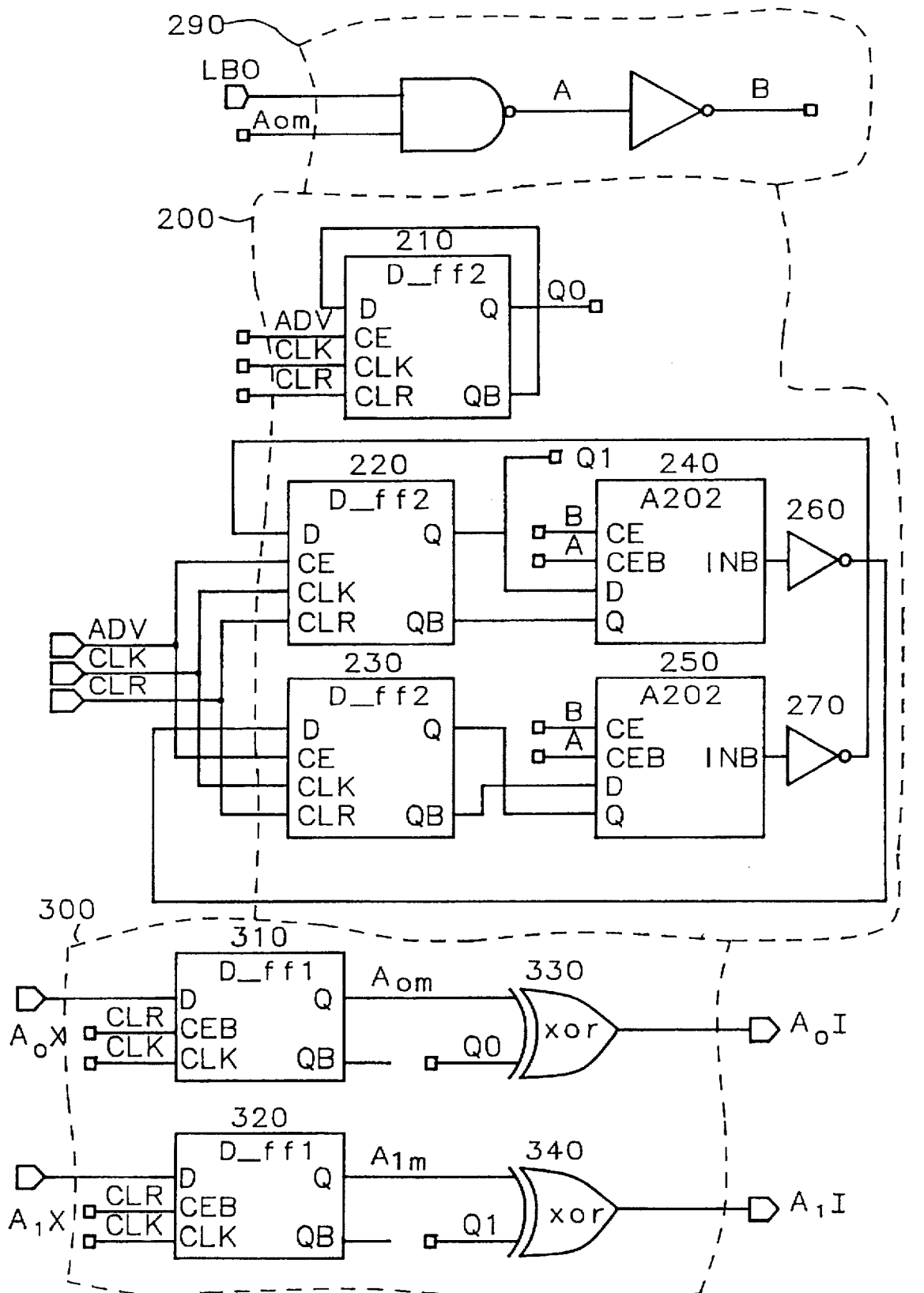
FIG. 3 is a schematic diagram of the Burst Counter Circuit of this invention.

FIG. 3 shows the preferred embodiment of this invention. A parallel burst counter consists of D-type Flip-Flops 210, 220, and 230 and logic circuit 240 and 250. D-type Flip-Flop 210 is configured as a toggling Flip-Flop. While the clear signal clr is 0, the output $Q_0$, $Q_1$ will be 0 at the rising edge of the clock signal clk. At each successive change of the clock signal clk from a logic 0 to a logic 1 while the advance signal ADV is at a logic 1, the output $Q_0$ will change state from the previous state that is from a logic 1 to a logic 0 or from a logic 0 to a logic 1.

The D-type Flip-Flops 220 and 230, and logic circuits 240 and 250 are configured so that the output $Q_1$ will change from a logic 0 to a logic 1 or from a logic 1 to a logic 0 at every alternate change of the clock signal clk while the advance signal ADV at a logic 1. The terminals A and B, that are connected to the logic circuits 240 and 250, determine the sequence of counts from the parallel burst counter 200. Table 4 shows the sequence of counts that possible from the outputs $Q_0$ and $Q_1$ of the parallel burst counter 200.

TABLE 4

|  | A | B | clr | clk | $Q_1$ | $Q_0$ |
|---|---|---|---|---|---|---|
| COUNT SEQUENCE 1 | 1 | 0 | 0 | ↑ | 0 | 0 |
|  | 1 | 0 | 1 | ↑ | 0 | 1 |
|  | 1 | 0 | 1 | ↑ | 1 | 0 |
|  | 1 | 0 | 1 | ↑ | 1 | 1 |
| COUNT SEQUENCE 2 | 0 | 1 | 0 | ↑ | 0 | 0 |
|  | 0 | 1 | 1 | ↑ | 1 | 1 |
|  | 0 | 1 | 1 | ↑ | 1 | 0 |
|  | 0 | 1 | 1 | ↑ | 0 | 1 |

The burst control circuit 290 determines the values of the signals A and B and consequently the type of count from the parallel burst counter. If the signal LBO is at a logic 0, the count is count sequence 1 from Table 4 and if the signal LBO is at a logic 1 and the signal AOM is at a logic 0 the count is again count sequence 1 from Table 4. Finally if the signal LBO is at a logic 1 and the signal AOM is at a logic 1 the count is now count sequence 2 from Table 4.

The programming input and data output section 300 consists of D-type Flip-Flops 310 and 320 and exclusive-or's (XOR) 330 and 340. The D-type Flip-Flop 310 has the first external address $A_0X$ connected to the data input terminal D. At the reception of the clear signal clr, the output has the value of the first external address $A_0X$. This value is will be maintained until there is another clear signal clr. The output Q of the D-type Flip-Flop 310 form the signal AOM that is connected to the burst control circuit 290. The D-type Flip-Flop 320 has the second external address $A_1X$ connected to the data input D. At the reception of the clear signal clr, the output Q of the D-type Flip-Flop 320 assumes a logical value of the second external address $A_1X$. Again, this value will remain until another clear signal clr is received.

The output of the D-type Flip-Flop 310 and the output $Q_0$ of the parallel burst counter 200 are connected to the input of XOR 330 and the output Q of the D-type Flip-Flop 320 and the output $Q_1$ of the parallel burst counter 200 are connected to the inputs of XOR 340. The outputs of the XOR's 330 and 340 form the outputs $A_0I$ and $A_1I$ of the programmable digital sequence counter.

The signal LBO determines the type of sequence that will be present at the outputs $A_0I$ and $A_1I$. If the signal LBO is a logic 1, the outputs $A_0I$ and $A_1I$ are linear burst sequences and if the signal LBO is at a logic 0, the output $A_0I$ and $A_1$ are interleaved burst sequences of binary numbers.

Table 5 shows the logical values for points within the circuit of FIG. 3 and for the output $A_0I$ and $A_1I$ for all combinations of input signals.

TABLE 5

| LBO | $A_1X$ | $A_0X$ | AOM | clr | clk | ADV | $Q_1$ | $Q_0$ | $A_1I$ | $A_0I$ |
|---|---|---|---|---|---|---|---|---|---|---|
| INTERLEAVED ||||||||||
| 0 | 0 | 0 | 0 | 0 | ↑ | X | 0 | 0 | 0 | 0 |
|  |  |  |  | 1 | ↑ | 1 | 0 | 1 | 0 | 1 |
|  |  |  |  | 1 | ↑ | 1 | 1 | 0 | 1 | 0 |
|  |  |  |  | 1 | ↑ | 1 | 1 | 1 | 1 | 1 |

TABLE 5-continued

| LBO | A₁X | A₀X | AOM | clr | clk | ADV | Q₁ | Q₀ | A₁I | A₀I |
|---|---|---|---|---|---|---|---|---|---|---|
| 0 | 0 | 1 | 0 | 0 | ↑ | X | 0 | 0 | 0 | 1 |
|   |   |   |   | 1 | ↑ | 1 | 0 | 1 | 0 | 0 |
|   |   |   |   | 1 | ↑ | 1 | 1 | 0 | 1 | 1 |
|   |   |   |   | 1 | ↑ | 1 | 1 | 1 | 1 | 0 |
| 0 | 1 | 0 | 1 | 0 | ↑ | X | 0 | 0 | 1 | 0 |
|   |   |   |   | 1 | ↑ | 1 | 0 | 1 | 1 | 1 |
|   |   |   |   | 1 | ↑ | 1 | 1 | 0 | 0 | 0 |
|   |   |   |   | 1 | ↑ | 1 | 1 | 1 | 0 | 1 |
| 0 | 1 | 1 | 1 | 0 | ↑ | X | 0 | 0 | 1 | 1 |
|   |   |   |   | 1 | ↑ | 1 | 0 | 1 | 1 | 0 |
|   |   |   |   | 1 | ↑ | 1 | 1 | 0 | 0 | 1 |
|   |   |   |   | 1 | ↑ | 1 | 1 | 1 | 0 | 0 |
| LINEAR |
| 1 | 0 | 0 | 0 | 0 | ↑ | X | 0 | 0 | 0 | 0 |
|   |   |   |   | 1 | ↑ | 1 | 0 | 1 | 0 | 1 |
|   |   |   |   | 1 | ↑ | 1 | 1 | 0 | 1 | 0 |
|   |   |   |   | 1 | ↑ | 1 | 1 | 1 | 1 | 1 |
| 1 | 0 | 1 | 1 | 0 | ↑ | X | 0 | 0 | 0 | 1 |
|   |   |   |   | 1 | ↑ | 1 | 0 | 1 | 1 | 0 |
|   |   |   |   | 1 | ↑ | 1 | 1 | 0 | 1 | 1 |
|   |   |   |   | 1 | ↑ | 1 | 0 | 1 | 0 | 0 |
| 1 | 1 | 0 | 0 | 0 | ↑ | X | 0 | 0 | 1 | 0 |
|   |   |   |   | 1 | ↑ | 1 | 0 | 1 | 1 | 1 |
|   |   |   |   | 1 | ↑ | 1 | 1 | 0 | 0 | 0 |
|   |   |   |   | 1 | ↑ | 1 | 1 | 1 | 0 | 1 |
| 1 | 1 | 1 | 1 | 0 | ↑ | X | 0 | 0 | 1 | 1 |
|   |   |   |   | 1 | ↑ | 1 | 1 | 1 | 0 | 0 |
|   |   |   |   | 1 | ↑ | 1 | 1 | 0 | 0 | 1 |
|   |   |   |   | 1 | ↑ | 1 | 0 | 1 | 1 | 0 |

Figure 4:
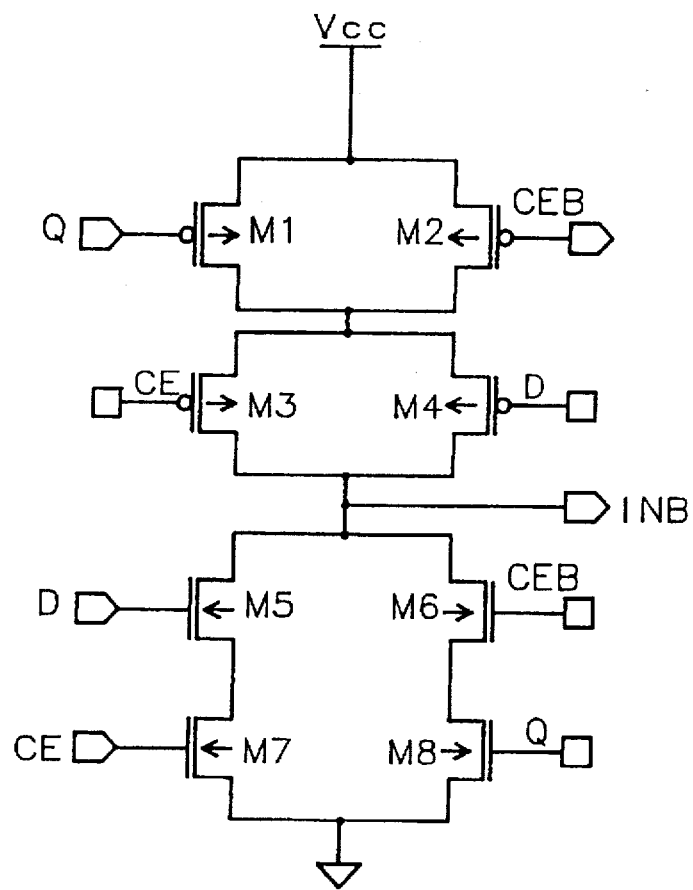
FIG. 4 is a schematic diagram of a two input/two AND/OR Invert utilized in this invention

FIG. 4 is a circuit schematic for the logic circuits 240 and 250 of FIG. 3. The P-type Metal Oxide Semiconductor Transistors (P-MOST) $M_3$ and $M_4$ with the N-type Metal Oxide Semiconductor Transistors (N-MOST) $M_7$ and $M_5$ form a first complementary MOS NAND gate, and P-MOST $M_1$ and $M_2$ with N-MOST $M_6$ and $M_8$ form a second complementary MOS NAND gate. The first and second NAND gates are connected in parallel to form an OR gate. The output of the logic circuit is at the point INB. The logic function implemented in the circuit of FIG. 4 is:

$$INB = \overline{((Q \cdot CEB) + (D \cdot CE))},$$

where table 6 shows the truth table for the logic circuit formed by FIG. 4.

TABLE 6

| D | Q | CE | CEB | INB |
|---|---|---|---|---|
| X | 0 | 0 | 1 | 1 |
| X | 1 | 0 | 1 | 0 |
| X | 0 | 0 | 1 | 1 |
| X | 1 | 0 | 1 | 0 |
| 0 | X | 1 | 0 | 1 |
| 0 | X | 1 | 0 | 1 |
| 1 | X | 1 | 0 | 0 |
| 1 | X | 1 | 0 | 0 |

X = DON'T CARE

Figure 5:
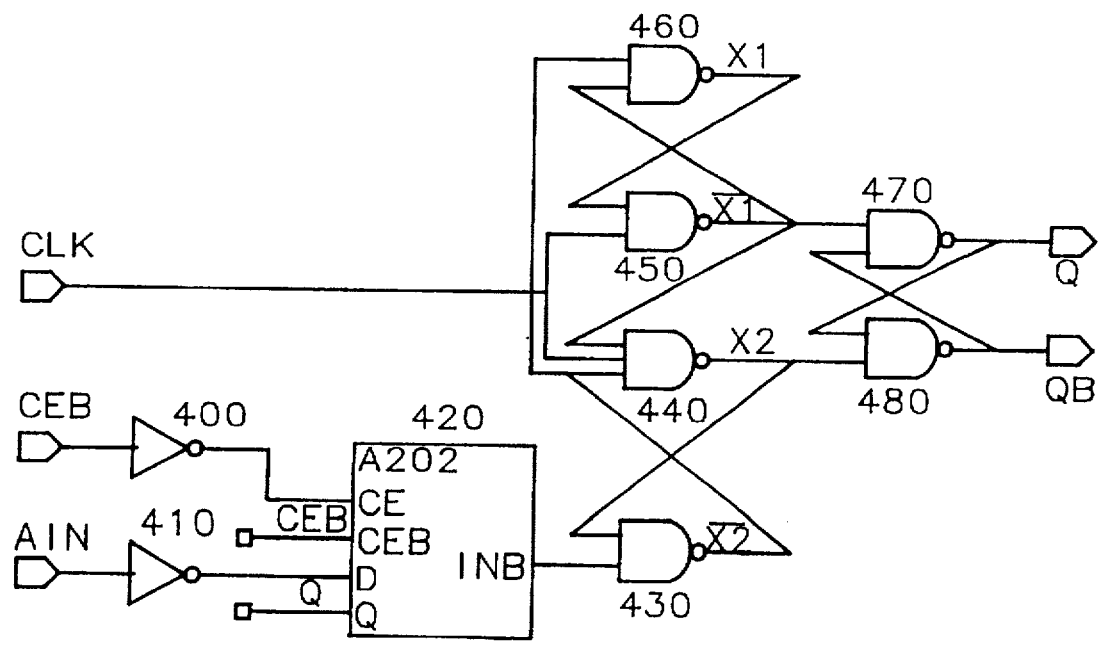
FIG. 5 is a schematic diagram of a D-type Flip-Flop utilized in this invention.

A schematic of D-type Flip-Flops 310 and 320 of FIG. 3 is shown in FIG. 5. The logic signal CEB is connected to the input of inverter 400 and CEB input of logic circuit 420. The output of inverter 400 is connected to the input CE of logic circuit 420. The input signal AIN is connected to the inverter 410. The output of inverter 410 is connected to the input D of the logic circuit 420.

The NAND gates 440 and 430 have their outputs $X_2$ and $\overline{X}_2$ cross coupled their inputs to form a Set-Reset (SR) Flip-Flop where the Reset terminal is connected to the INB output of logic circuit 420 and the set terminal is connected to the of the clock signal clk and the output $\overline{X}_1$ of the NAND gate 450.

The NAND gates 450 and 460 also have their outputs $X_1$ and $\overline{X}_1$ cross-coupled to each others inputs to form a second SR Flip-Flop. The reset terminal is connected to the clock signal clk and the set signal is connected to the output $\overline{X}_2$ of the first SR Flip-Flop.

The NAND gates 470 and 480 also have their outputs Q and $Q_B$ cross-coupled to each others inputs to form a third SR Flip-Flop. The reset terminal is the output $X_2$ of NAND gate 440 and the set terminal is the output $\overline{X}_1$ of NAND gate 450.

The Table 6 is a Truth Table for the outputs Q and $Q_B$ for all combination of the inputs.

TABLE 6

| AIN | CEB | CLK | Q | Q_B |
|---|---|---|---|---|
| 0 | 0 | ↑ | 0 | 1 |
| 1 | 0 | ↑ | 1 | 0 |
| 0 | 1 | ↑ | UC | UC |
| 1 | 1 | ↑ | UC | UC |

UC = Unchanged

Figure 6:
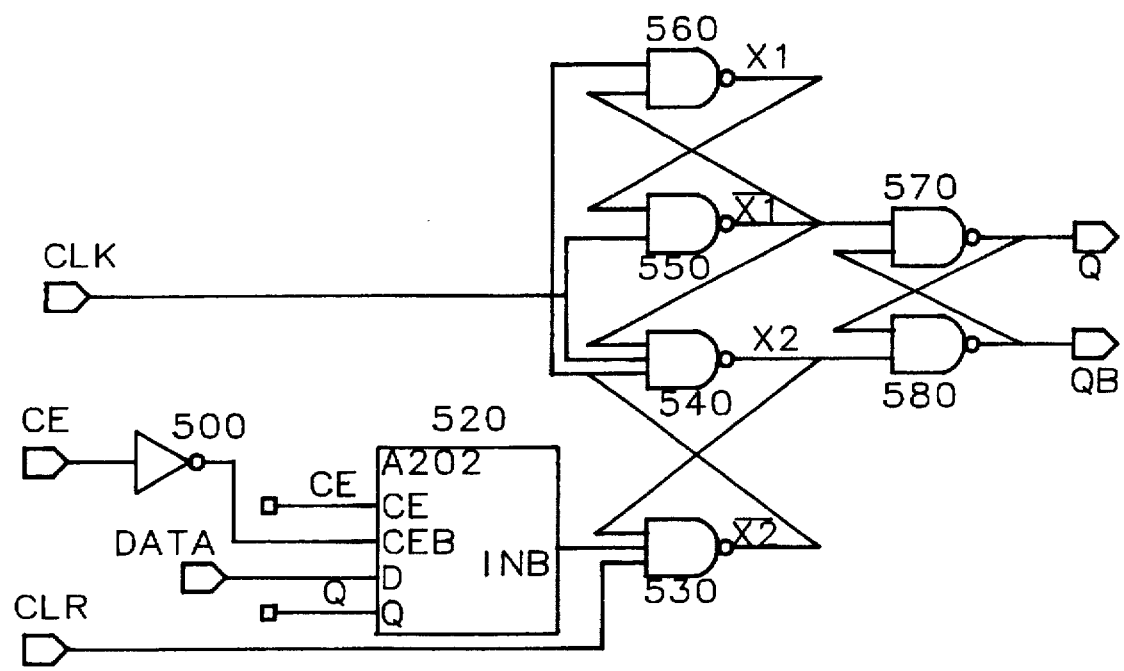
FIG. 6 is a schematic diagram of a D-type Flip-Flop utilized in this invention.

FIG. 6 is a schematic diagram of the D-type Flip-Flops 220 and 230 of FIG. 3. The input signal CE is connected to the input of inverter 500 and the input CE of logic circuit 520. The output of the inverter 500 is connected to the input CEB of the logic circuit 520. The input signal DATA is connected to the input D of the logic circuit of 520 and the Q input of the logic circuit 520 is the output Q of the NAND gate 570.

The NAND gates 530 and 540 have their outputs $X_2$ and $\overline{X}_2$ cross coupled to each others inputs to form an SR Flip-Flop where the Reset terminal is determined by the NAND combination of INB output of logic circuit 520 and the clear input signal clr. The set is determined by the NAND combination of the output $X_1$ of the NAND gate 550 and the input clock signal clk.

A second SR Flip-Flop is formed by NAND gates 550 and 560 with their output $X_1$ and $\overline{X}_1$ cross-coupled to each other inputs. The reset terminal is the input clock signal clk and the set terminal is the output $\overline{X}_2$ of the NAND gate 530.

A third SR Flip-Flop is formed by NAND gates 570 and 580 with their outputs Q and $Q_B$ cross-coupled to each others inputs. The set terminal is the output $\overline{X}_1$ of the second SR Flip-Flop and the reset terminal is the output $X_2$ of the first Flip-Flop. The outputs of the D-type Flip-Flop (220 or 230 of FIG. 3) is the output Q and $Q_B$ of the third SR Flip-Flop.

The Table 7 is a Truth Table for the outputs Q and $Q_B$ for all combination of the inputs.

TABLE 7

| DATA | CE | CLK | CLR | Q | Q_B |
|---|---|---|---|---|---|
| 1 | 1 | ↑ | 1 | 1 | 0 |
| 0 | 1 | ↑ | 1 | 0 | 1 |
| X | X | ↑ | 0 | 0 | 1 |
| X | 0 | ↑ | 1 | UC | UC |

X = DON'T CARE
UC = UNCHANGED

Figure 7:
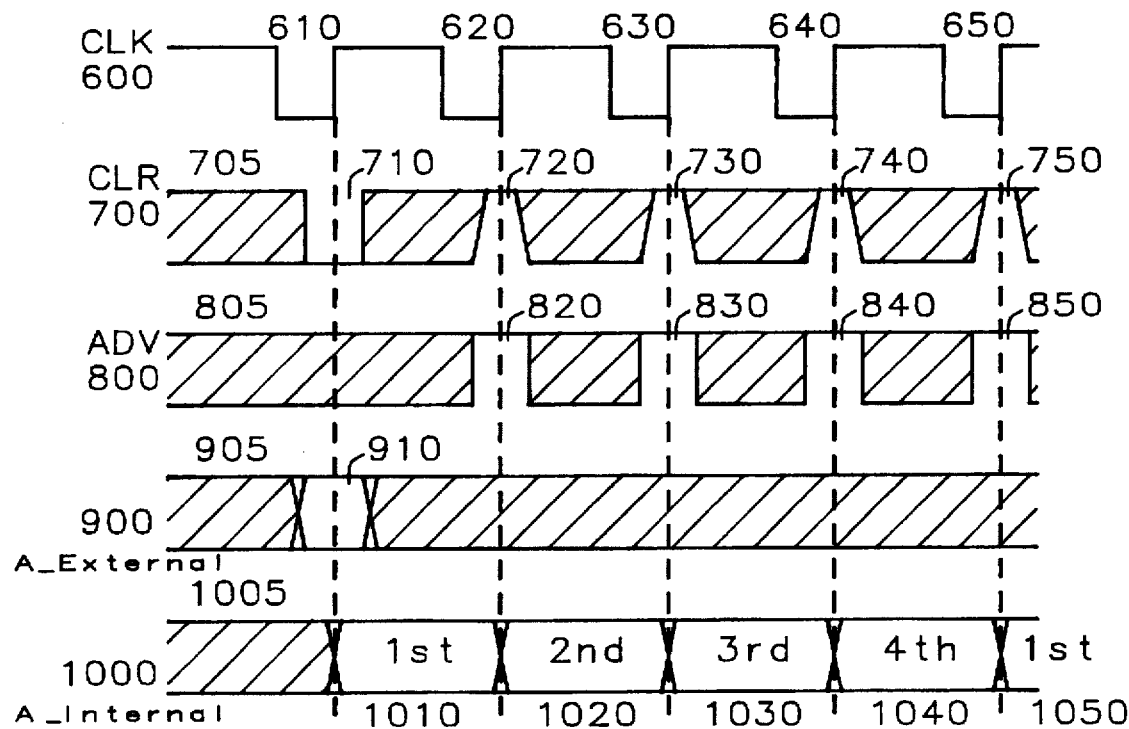
FIG. 7 is a timing diagram of the burst counter of this invention.

A timing diagram of the programmable burst counter of FIG. 3 is shown in FIG. 7. An external address A__external 900 is presented to the programmable burst counter of FIG. 3 prior to the rising edge 610 of the clock 600 and the clear signal clr 700 is brought to a logic 0 710. At the rising edge of the clock pulse 610 and while the clear signal clr 700 is at a logic 0 719, the initial address A__external 900 is transferred to the first internal address 1010 A__internal 1000 after the completion of the rising edge 610 of clock clk 600. At each successive rising edge of the clock clk 620, 630, and 640 and with each advance ADV 800 pulse 820, 830, and 840, the internal address A__internal 1000 will increment to the second address 1020, then the third address 1030, and then the fourth address 1040. At the rising edge of the 650 clock clk 600 and while the advance ADV 850 is a logical 1, the counter will re-initialize to the first address 1050 and continue this sequence.

The hashed areas 705, 805, and 905 are times when the respective inputs are not examined and may assume any value of a logic 1 or a logic 0. The cross-hashed area 1005 are times when the output internal address A__internal 1000 is at an indeterminate state.

While the invention has been particularly shown and described with reference to the preferred embodiments thereof, it will be understood by those skilled in the art that various changes in form and details may be made without departing from the spirit and scope of the invention.

What is claimed is:

1. A programmable digital sequence counter to selectively provide a plurality of binary outputs which are of a set of sequences of digital numbers consisting of interleaved burst digital numbers and linear burst digital numbers, comprising
  a) a counting means to provide one set of counting sequences, wherein the set of counting sequences includes linear counting sequence and an interleaved counting sequence;
  b) a data output means coupled to the counting means and to the plurality of binary outputs to convert one of the set of counting sequences to one of the sequences of digital numbers starting at a beginning address and proceeding through said sequence of digital numbers;
  c) an external addressing means coupled to the data output means to provide a beginning address for the set of sequence of digital numbers;
  d) a clocking means coupled to the counting means and the data output means to provide a series of timing signals to synchronize the outputs of said programmable digital sequence counter;
  e) a burst sequence selection means coupled to the counting means to provide a selection signal to select between the interleaved burst digital numbers and the linear burst digital numbers;
  f) a clearing means coupled to the counting means to set the output of said programmable digital sequence counter to an initial digital number; and
  g) an advancing means coupled to the counting means to provide an advancing signal to advance said programmable digital sequence counter through the sequence of digital numbers.

2. The programmable digital sequence counter of claim 1 wherein the data output means comprises:
  a) a plurality of latching means to capture said beginning address; and
  b) a gating means coupled to the plurality of latching means and to said counting means to convert one of the counting sequences to one of the set of sequences of digital numbers starting at the beginning address and said sequence of digital numbers at the plurality of outputs.

3. The counter of claim 1 wherein the counter means comprises;
  a) a plurality of toggling means wherein each toggling means provides for each digit of the set of the counting sequences;
  b) a timing circuit to synchronize the plurality of toggling means to the series of timing signals and the advancing signal; and
  c) a burst control means to initialize the plurality of toggling means to establish the counting sequence from the selection signal.

4. A memory address generation circuit for the generation of one of a set of sequences of addresses to select a location in a memory array for the storage and retrieval of digital data from said memory location, wherein said set of sequences of addresses include of interleaved burst addresses and linear burst addresses, comprising;
  a) an address counting means to provide a counting sequence;
  b) a data output means coupled to the address counting means and to the plurality of binary outputs to convert the counting sequence to one of the sequences of addresses starting at a beginning address and proceeding through said sequence of addresses;
  c) a burst sequence selection means coupled to the address counting means to provide a selection signal that describes which of the set of the sequences, a linear burst sequence and an interleaved burst sequence, the address counting means is to provide;
  d) an external addressing means coupled to the data output means to provide a beginning address for the set of sequence of digital numbers;
  e) a clocking means coupled to the address counting means and the data output means to provide a series of timing signals to synchronize the outputs of said memory address generation circuit;
  f) a burst sequence selection coupled to the counting means to provide a selection signal to select between the interleaved burst digital numbers and the linear burst digital numbers;
  g) a clearing means coupled to the address counting means to set the output of said memory address generation circuit to an initial digital number; and
  h) an advancing means coupled to the address counting means to provide an advancing signal to advance said memory address generation circuit through the sequence of digital numbers.

5. The address generation circuit of claim 4 wherein the address counting means comprises:
  a) a plurality of toggling means wherein each toggling means provides each digit of the counting sequence;
  b) a timing circuit to synchronize the plurality of toggling means to the series of timing signals and the advancing signal; and
  c) a burst control means to initialize the plurality of toggling means to establish the counting sequence from the selection signal.

6. The memory address generation circuit of claim 3 wherein the data output means comprises:
  a) a plurality of latching means to capture said beginning address; and
  b) a gating means coupled to the plurality of latching means and to said address counting means to convert one of the counting sequence to one of the set of sequences addresses starting at the beginning address.

7. A programmable burst sequence counting circuit to provide a plurality of outputs which are the digits of a binary number, wherein a sequence of numbers may be selected from a set of sequences of numbers consisting of linear burst sequence and interleaved burst sequence, comprising:

a) a burst sequence generation coupled to a counting means and to the plurality of binary outputs to convert a sequence of counting binary digits to one of the set of sequences of numbers starting at a starting binary number and proceeding through said sequence of numbers;

b) the counting means coupled to the burst sequence generation means to provide the sequence of counting binary digits to the burst sequence generation means;

c) a burst sequence selection means coupled to the counting means to select from the set of sequence of numbers the sequence of numbers to be generated by the burst sequence generation means;

d) a clocking means coupled to the counting means to provide a series of timing signals to synchronize the outputs of said programmable burst sequence counting circuit;

e) a clearing means coupled to the counting means to set the output of said programmable burst sequence counting circuit to an initial digital number;

f) an advancing means coupled to the counting means to provide an advancing signal to advance said programmable burst sequence counting circuit through the sequence of digital numbers; and g) an external addressing means, coupled to the burst sequence selection means to establish the starting binary number for the counting means and coupled to the burst sequence selection means to establish a starting binary number for the counting means.

8. The programmable burst sequence counting circuit of claim 7 wherein the burst sequence generation means comprises:

a) a plurality of latching means to capture and retain said starting binary number; and b) a gating means coupled to the plurality of latching means to convert one of the sequences of counting binary digits beginning at the starting binary number and progressing through the digits of the binary number.

9. The programmable burst sequence counting circuit of claim 7 wherein the counting means comprises:

a) a plurality of toggling means wherein each toggling means provides a counting sequence for each counting binary digit;

b) a timing circuit to synchronize the plurality of toggling means to the series of timing signals and the advancing signal; and c) a burst control means to initialize the plurality of toggling means to establish the counting sequence from the selection signal.

\* \* \* \* \*

UNITED STATES PATENT AND TRADEMARK OFFICE
CERTIFICATE OF CORRECTION

PATENT NO. : 5,708,688
DATED : 1/13/98
INVENTOR(S) : Tah-Kang Joseph Ting, Gyh-Bin Wang
Jeng-Tzong Shih It is certified that error appears in the above-indentified patent and that said Letters Patent is hereby corrected as shown below:

Title page, item [75], correct Inventor's name from "Ghy-Bin Wang" to --Gyh-Bin Wang--

Signed and Sealed this

Thirty-first Day of March, 1998

Attest:

BRUCE LEHMAN

Attesting Officer

Commissioner of Patents and Trademarks